United States Patent
Taguchi et al.

(10) Patent No.: US 6,849,383 B2
(45) Date of Patent: Feb. 1, 2005

(54) PHOTOSENSITIVE RESIN LAMINATE, AND SIGNBOARD PLATE AND SIGNBOARD MADE OF THE LAMINATE

(75) Inventors: Yuji Taguchi, Ohtsu (JP); Koji Syoki, Ohtsu (JP); Keiichi Motoi, Ohtsu (JP); Hajime Kouda, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 99 days.

(21) Appl. No.: 09/912,437

(22) Filed: Jul. 26, 2001

(65) Prior Publication Data

US 2002/0037475 A1 Mar. 28, 2002

(30) Foreign Application Priority Data

| | | | |
|---|---|---|---|
| Jul. 26, 2000 | (JP) | ...... | 2000-225650 |
| Jul. 27, 2000 | (JP) | ...... | 2000-227431 |
| Aug. 10, 2000 | (JP) | ...... | 2000-243126 |
| Nov. 2, 2000 | (JP) | ...... | 2000-336217 |

(51) Int. Cl.$^7$ ................................. G03F 7/11
(52) U.S. Cl. ................ 430/273.1; 430/271.1; 430/320
(58) Field of Search .......... 730/271.1, 273.1, 730/320, 18

(56) References Cited

U.S. PATENT DOCUMENTS

| | | | | |
|---|---|---|---|---|
| 4,041,204 A | * | 8/1977 | Hepher et al. | 430/253 |
| 4,098,952 A | * | 7/1978 | Kelly et al. | 428/483 |
| 4,234,673 A | * | 11/1980 | Scrutton et al. | 430/252 |
| 4,391,767 A | * | 7/1983 | Pears | 264/210.3 |
| 4,963,471 A | * | 10/1990 | Trout et al. | 430/282.1 |
| 5,374,184 A | * | 12/1994 | Platzer et al. | 430/262 |
| 5,565,501 A | * | 10/1996 | Hosokawa et al. | 522/83 |
| 2002/0006581 A1 | * | 1/2002 | Motoi et al. | 430/271.1 |
| 2003/0091802 A1 | * | 5/2003 | Vreeland, Jr. et al. | 428/216 |

FOREIGN PATENT DOCUMENTS

| | | | | |
|---|---|---|---|---|
| EP | 1040912 a2 | * | 10/2000 | B32B/27/08 |
| GB | 2 153 100 a | * | 8/1985 | G03C/1/68 |

OTHER PUBLICATIONS

CALCE, "Material Hardness" found at http://www.calce.umd.edu/general/Facilities/Hardness_ad_.htm , 20 pages, Copyrights 2001 by CALCE and the University of Maryland, College Park, MD. The file copied from the web was last modified Friday May 3, 2002.*

Carl Izzo, Painting Clinic–Film Defects Aug. 2001, from www.pfonline.com/articles/clinics/0801cl_paint1., one page, "Film Defects", PF Online from www.pfonline.com online component of Products Finishing Magazine, Gardner Publications, Inc.*

KENTEK, "Wavelength Chart", 2002 copyright from http://www.kentek–laser.com/helpers/wavel/htm, one page.*

DYMAX, from "wysiwyg://7/http://www.dymax.com/products/curing_equipment/definition_of_terms.asp", Definition of Terms, two pages, Dymax Corporation, Torrington, CT, 2001 copyright. 5 pages.*

* cited by examiner

*Primary Examiner*—Cynthia Hamilton
(74) *Attorney, Agent, or Firm*—Morrison & Foerster LLP

(57) ABSTRACT

A photosensitive resin laminate comprising at least a support, an adhesive layer and a photosensitive resin layer, wherein the photosensitive resin laminate shows a total light transmission of not less than 60%, or satisfies the following formula (1):

$$\{(A-B)/A\} \times 100 \leq 15 \qquad (1)$$

wherein A is a total light transmission (%) of the support and B is a total light transmission (%) of the photosensitive resin laminate.

20 Claims, No Drawings

PHOTOSENSITIVE RESIN LAMINATE, AND SIGNBOARD PLATE AND SIGNBOARD MADE OF THE LAMINATE

TECHNICAL FIELD OF THE INVENTION

The present invention relates to a photosensitive resin laminate, and a signboard plate and a signboard made of the laminate, which are used for signboards such as display panel, decoration shield, name plate, Braille board and the like. Particularly, the present invention relates to a photosensitive resin laminate, and a signboard plate and a signboard made of the laminate, which are superior in design and resistance to light.

BACKGROUND OF THE INVENTION

A photosensitive resin layer is exposed to light through a pattern and developed to produce a signboard and the like. Photosensitive resin laminates made by the use of a photosensitive resin are disclosed in JP-A-58-55927, JP-A-9-6267 and the like and used for display panels having a relief, signboards containing Braille and the like.

However, signboards for use in these days are required to stand bending during processing, to be transparent and the like. Moreover, the need for good designs of signboards is increasing in recent years, to the point that a conventional simple signboard having a typical concavo-convex pattern colored with a color paint is not satisfactory.

However, a photosensitive resin laminate for general use, which comprises a phenol board as a support, is not suitable for bending during processing of a signboard or preparation of a transparent signboard. Even when a transparent and colorless substrate is used as a support, the photosensitive resin itself is colored. Moreover, it is colored when placed near a window due to the UV light. Accordingly, there has arisen a demand on a photosensitive resin laminate suitable for processing into a signboard having a good design.

A photosensitive resin composition contains a naphthoquinone compound and the like for the purpose of inhibiting thermal polymerization and for adjusting sensitivity and the like. Because of the color of these compounds, the use of these compounds inevitably results in a colored photosensitive resin composition, which is problematic for the production of a signboard having a superior design. Even if the amount of addition of these compounds is reduced with the hope of suppressing the coloring, the polymer tends to become a gel during the production, thus practically preventing the production.

It is therefore an object of the present invention to provide a photosensitive resin laminate for signboards usable for display panel, decoration shield, name plate, Braille board and the like, which laminate has a superior design, which can be bent during processing of a signboard, and from which a transparent signboard can be produced, as well as a plate for a signboard and a signboard, which are made of this resin laminate, which have superior design and superior resistance to light, and which show lower degrees of coloring by UV.

SUMMARY OF THE INVENTION

According to the present invention, there has now been provided the following.
(1) A photosensitive resin laminate comprising at least a support, an adhesive layer and a photosensitive resin layer, wherein the photosensitive resin laminate shows a total light transmission of not less than 60%.
(2) A photosensitive resin laminate comprising at least a support, an adhesive layer and a photosensitive resin layer, which laminate satisfying the following formula (1):

$$\{(A-B)/A\} \times 100 \leq 15 \tag{1}$$

wherein A is a total light transmission (%) of the support and B is a total light transmission (%) of the photosensitive resin laminate.
(3) The photosensitive resin laminated of the above-mentioned (1) or (2), wherein the photosensitive resin layer has a thickness of not less than 500 μm and a Shore hardness of not less than 50.
(4) The photosensitive resin laminate of the above-mentioned (1) or (2), wherein the photosensitive resin layer has an absorbance at 400 nm–600 nm of not more than 0.3.
(5) The photosensitive resin laminate of the above-mentioned (1) or (2), wherein the photosensitive resin layer has a scattering rate of not more than 25%.
(6) The photosensitive resin laminate of the above-mentioned (1) or (2), wherein the photosensitive resin layer has a turbidity of not more than 3.5.
(7) The photosensitive resin laminate of the above-mentioned (1) or (2), wherein the photosensitive resin layer contains a hydroxylamine derivative.
(8) A plate for a signboard comprising the photosensitive resin laminate of the above-mentioned (1) or (2).
(9) A signboard having a relief, which signboard comprises the photosensitive resin laminate of the above-mentioned (1) or (2), wherein the photosensitive resin layer has a thickness of not less than 500 μm and is formed at least on the support via the adhesive layer, and a coating layer having an ultraviolet transmission at 400 nm of not more than 50% on its surface.
(10) A signboard having a relief, which comprises the photosensitive resin laminate of the above-mentioned (1) or (2), and a layer having an image laminated on a side of the support.
(11) The signboard of the above-mentioned (9) or (10), wherein the layer having the image is directly printed on the back of the support.

DETAILED DESCRIPTION OF THE INVENTION

The present invention is explained in more detail in the following.

The photosensitive resin laminate of the present invention comprises at least a support, an adhesive layer and a photosensitive resin layer, wherein the photosensitive resin laminate as a whole has a total light transmission of not less than 60%. The photosensitive resin layer to be used in the present invention preferably has a total light transmission of not less than 60%, more preferably not less than 70%, and particularly preferably not less than 75%.

The photosensitive resin laminate of the present invention characteristically satisfies the following formula (1):

$$\{(A-B)/A\} \times 100 \leq 15 \tag{1}$$

wherein A is a total light transmission (%) of the support and B is a total light transmission (%) of the photosensitive resin laminate.

The photosensitive resin layer in the present invention preferably shows an absorbance at 400 nm–600 nm of not more than 0.3, more preferably not more than 0.2. When the absorbance exceeds 0.3, the photosensitive resin unpreferably becomes appreciably colored.

The photosensitive resin layer in the present invention preferably shows a scattering rate of not more than 25%, more preferably not more than 20%. When the scattering rate exceeds 25%, a slit depth which is among the printing properties, becomes unpreferably smaller.

The photosensitive resin layer in the present invention preferably shows a turbidity of not more than 3.5, particularly not more than 3.0. When the turbidity exceeds 3.5, the photosensitive resin shows poor transparency, which is not preferable.

The photosensitive resin composition to be used as the photosensitive resin layer may be known, and is exemplified by a soluble polymer compound (e.g., poly(vinyl alcohol), polyamide, polyether ester amide, polyether amide, polyurethane and the like), photopolymerizable or photocrosslinkable monomer (e.g., acrylate of polyhydric alcohol, epoxy acrylate of polyhydric alcohol, N-methylolacrylamide and the like), photopolymerization initiator (e.g., benzyldimethyl ketal, benzoindimethyl ether and the like), and a photosensitive resin composition containing, where necessary, additives such as a plasticizer, a surfactant, a dye, a heat stabilizer, a sensitivity adjusting agent, a thermal polymerization inhibitor, an ultraviolet absorber and the like.

Examples of the heat stabilizer include phenothiazine and hydroxylamine derivative, such as cupferron derivative, and the like. In the present invention, the concurrent use of a hydroxylamine derivative is preferable.

Examples of the hydroxylamine derivative include cupferron derivatives such as N-nitrosophenylhydroxylamine aluminum salt, N-nitrosophenylhydroxylamine ammonium salt and the like, cupferron analogs such as N-benzoylphenylhydroxylamine, benzohydroxamic acid, 3-hydroxyl-1,3-diphenyltriazine and the like, N,N-diethylhydroxylamine, and N-(t-butyl)hydroxylamine hydrochloride. Of these, N-nitrosophenylhydroxylamine aluminum salt and N-nitrosophenylhydroxylamine ammonium salt are particularly preferable in the present invention.

Referring to the mixing ratio of these, when the resin solid is less than 0.005 wt %, the thermal stabilization effect is not exerted, causing polymer gelation at halfway during the production, whereas when it exceeds 0.05 wt %, the resin composition produced becomes colored, thereby giving rise to a difficulty in producing a transparent resin composition. Thus, to make the photosensitive resin layer transparent and colorless, the resin solid as expressed by the mixing ratio of these is preferably 0.005–0.05 wt %, more preferable 0.01–0.03 wt %.

Furthermore, hydroquinone, hydroquinone monomethyl ether, 2,6-di-t-butyl-p-cresol and the like may be added in a proportion of 0.001–5 wt % as a thermal polymerization inhibitor. As a sensitivity adjusting agent, a compound having an absorption band at 300–400 nm may be added, such as naphthalene derivatives (e.g., phenothiazine, naphthoic acid and the like), anthracene derivatives (e.g., 9-hydroxyanthracene and the like), and the like. It is also possible to alter the properties of a photocured substance by adding a plasticizer, such as low molecular weight plasticizers (e.g., ester, amide and the like), and oligomers (e.g., polyester, polyether, liquid rubber and the like).

The aforementioned photosensitive resin layer preferably has a thickness of not less than 500 $\mu$m, particularly 800–1200 $\mu$m. The Shore hardness is preferably not less than 50 particularly preferably 55–65.

The support (hereinafter sometimes to be referred to as a supporting plate) to be used in the present invention is preferably transparent in view of design, and preferably has a total light transmission of not less than 60%, more preferably not less than 65%, most preferably not less than 70% and particularly preferably not less than 80%. The total light transmission of the support is determined such that the above-mentioned formula (1) is satisfied. When the total light transmission is less than 60%, the support fails to provide a good taste after processing into a signboard and is unsuitable for a signboard having a superior design. Examples thereof include glass plate, colorless polymer-molded plate made of polyester resins such as polycarbonate resin, polyethylene terephthalate resin and the like, acrylic resins such as polymethylmethacrylate and the like, copolymer resin of polymethylmethacrylate and styrene, vinyl chloride resin, modified polyethylene terephthalate resin obtained by copolymerization of cyclohexanedimethanol and the like, and the like. For light resistance, acrylic resin and copolymer resin of polymethylmethacrylate and styrene are preferable. For an improved light resistance, a coating layer containing an ultraviolet absorber may be formed on the support, an acrylic resin superior in light resistance may be laminated on the surface. For improved light resistance, modified polyethylene terephthalate resin having an acrylic resin layer or a layer containing an ultraviolet absorber, and a modified polyethylene terephthalate resin containing an ultraviolet absorber are preferable. This polymer-molded plate may be made of a resin modified by copolymerization or blending or a resin modified by adding an additive such as a plasticizer and the like.

The support has a thickness of not less than 1 mm when it is used as a signboard and less than 1 mm when it is used as a precursor for producing a signboard. When it is used as a signboard, a thickness generally in the range of 1 mm–10 mm is employed depending on the use and design. When the support has a thickness of less than 1 mm, the support itself may warp easily, which is not suitable for signboard use, whereas a thickness exceeding 10 mm is unpreferable because the plate does not cut easily and inconveniently weighs too much.

The support usable in the present invention preferably has a Shore D hardness of not less than 35, more preferably not less than 55, particularly desirably 75. When Shore D hardness is less than 35, the support itself may warp easily, thus unpreferably lacking the retention performance as a signboard. The Shore hardness is measured with a Shore durometer by applying a load (4.536 g) on a needle and measuring the depth of the needle thrust into a material.

When the laminate of the present invention is used as a signboard, moreover, the design of the aforementioned supporting plate is reflected well. For example, when the supporting plate is an aluminum plate or a metal-plated resin plate, the signboard becomes metallic, and when it is a wooden board, the woodgrain is reflected on the signboard.

When the supporting plate is also transparent and the design is printed on the supporting plate side, the signboard carries the design.

The present invention also provides a plate for a signboard, which is made of the above-mentioned photosensitive resin laminate. In the present invention, by the "plate for a signboard" is meant a photosensitive resin laminate comprising a support having a thickness of not less than 1 mm, which can form a signboard by exposure to light and developing.

The present invention provides a signboard having a relief, which comprises the above-mentioned photosensitive resin laminate, wherein the photosensitive resin layer has a thickness of not less than 500 $\mu$m and is formed at least on a support via an adhesive layer, and preferably a coating layer on its surface.

The coating layer in the present invention should show an ultraviolet transmission at 400 nm of not more than 50%, preferably not more than 40%, particularly preferably not more than 35%.

To make the aforementioned ultraviolet transmission not more than 50% in the present invention, for example, a coating layer capable of absorbing the UV light may be formed on the surface of a signboard having a relief. As the coating layer, a commercially available coating agent can be used, which is specifically acrylic polymer, urethane polymer and the like.

For absorption of UV light, a low molecular weight ultraviolet absorber may be added to the coating layer, a polymer having a UV-absorbing functional group introduced therein may be added or other method may be employed. Examples of the ultraviolet absorber include 2-aminobenzophenone and the like having benzene as a skeleton, propylene glycol 2-hydroxy-3-naphthoic acid ester and the like having naphthalene as a skeleton, 9-anthracenemethanol and the like having an anthracene skeleton, dihydrothio-p-toluidine and the like having a benzthiazole skeleton and the like. Of these, benzophenone compounds and dihydrothio-p-toluidine are preferable.

The addition of an ultraviolet absorber to the above-mentioned coating layer and the amount of the UV-absorbing functional group to be introduced into the polymer components can be determined as appropriate depending on the ultraviolet transmission at 400 nm.

While the thickness of the above-mentioned coating layer can be determined as appropriate depending on the ultraviolet transmission at 400 nm, it is preferably 5–300 $\mu$m desirably 10–200 $\mu$m. When it is less than 5 $\mu$m, the film strength of the coating layer becomes insufficient, whereas when it exceeds 300 $\mu$m, uniform coating without crawling becomes unpreferably difficult.

A coating layer can be formed on the surface of a signboard by a known coating method such as brushing, roller coating, spraying, dipping and the like.

The coating layer in the present invention may be directly applied on the surface of a relief made of a photosensitive resin layer, or a different layer (e.g., colored layer and the like) may be formed between a relief and a coating layer, or a different layer may be formed on the coating layer. Moreover, the aforementioned colored layer may act as a coating layer.

The present invention also provides a signboard having a relief, which is obtained using the above-mentioned photosensitive resin laminate, optionally further comprising a layer having an image laminated on a support side.

The images to be used in the present invention includes anything generally expressed two-dimensionally, showing human, figure, pattern and the like. For example, human, scenery, design, pattern and the like may be shown. In the context of the present invention, letters or Chinese characters may be also used.

Examples of the layer having a concrete image include photographs, paintings, printed matters and the like. The layer having an image may contain paper, film or plate as a support, or may be without a support.

The layer having an image is laminated by direct printing on the back, adhering photograph, printed matter and the like having images formed on a support of paper, film and the like, or by other method.

For direct printing on the back of the support, screen printing, ink jet printing, thermal transfer printing and the like can be used. In view of the applicability to a plate support, screen printing is superior.

For adhering the photograph, printed matter and the like having images, an adhesive is applied onto the back of a support and adhered or other method may be employed. When a signboard has a frame etc. that can fix the entire signboard, a photograph, printed matter and the like having images may be registered on the back of the support and fixed with the frame and the like for laminating a layer having an image.

The photosensitive resin laminate of the present invention can be produced, for example, by applying the adhesive to be mentioned later on the aforementioned supporting plate and laminating a photosensitive resin layer. A photosensitive resin can be laminated on a supporting plate by a known method, such as heat press, injection molding, melt extrusion, solution casting, lamination and the like.

The aforementioned photosensitive resin layer may be laminated in advance on, for example, a resin film of polyethylene terephthalate and the like as a support (hereinafter to be referred to as a photosensitive resin laminate precursor) and, when preparing a signboard therefrom, it is laminated on the aforementioned supporting plate having a thickness of not less than 1 mm upon peeling off of the resin film.

The aforementioned photosensitive resin laminate precursor can be prepared by a method generally employed for forming a photosensitive resin laminate for a printing plate. For example, a photosensitive resin composition is melt-extruded in between the aforementioned resin film (preferably without an adhesive in this case) and a 125 $\mu$m-thick polyester cover film having a layer of non-adhesive transparent polymer that can be dispersed or dissolved in a developing solution [(poly(vinyl alcohol), celluloses and the like, which is also called a slip coat layer)] in a thickness of 1–3 $\mu$m, whereby a photosensitive resin laminate precursor comprising a resin film, a photosensitive resin layer, a slip coat layer and a cover film in order can be obtained.

In the present invention, the adhesive layer used for adhering a photosensitive resin layer (optionally having a slip coat layer and a cover film) to the aforementioned supporting plate may be a known adhesive. Examples thereof include polyester urethane adhesives wherein a soluble polyester is cured with polyhydric isocyanate, epoxy adhesives and the like. Of these, polyester urethane adhesive is preferable because it is superior in the adhesion to a photosensitive resin, particularly polyethylene terephthalate resin and modified polyethylene terephthalate resin of the polyester urethane adhesives, particularly an adhesive comprising polyester and isocyanurate type polyhydric isocyanate is desirable because it dries at a low temperature. The adhesive layer composition may contain small amounts of other components. Examples of the additive include plasticizer, dye, ultraviolet absorber, halation preventive, surfactant, photopolymerizable vinyl monomer and the like.

An adhesive layer is formed on a support typically by applying a solution of the composition for adhesive layer in a predetermined thickness and removing the solvent. The application method may be known, such as roll coater, curtain flow coater, slit die coater, gravure coater, spray and the like. The adhesive layer after coating on a support is generally dried by blowing hot air in a drying furnace. The adhesive layer of the present invention may be dried at not less than 30° C. and not more than 120° C. for a suitable period of time, wherein 15° C.–80° C. is preferable, and 20° C.–70° C. is desirable. When it exceeds 80° C., the support unpreferably gets warped and deformed. The temperature lower than 15° C. prolongs the drying time, which is also unpreferable. The treatment for 1 min–30 min is appropriate.

The adhesive layer preferably has a thickness of 0.5 μm–100 μm. When the thickness is not more than 0.5 μm, the adhesive power is difficult to achieve between the photosensitive resin layer and the adhesive layer, whereas when it exceeds 100 μm, the drying after application takes a long time, and a problem of entrained bubbles occurs due to foaming during drying of the liquid applied. In view of the above, the adhesive layer preferably has a thickness of 0.5 μm–100 μm, particularly preferably 1 μm–50 μm.

The photosensitive resin laminate of the present invention comprising a support, an adhesive layer and a photosensitive resin layer, which may further have a slip coat layer and a cover film, has a total light transmission of not less than 60%, preferably not less than 70%, particularly preferably not less than 75%. When the total light transmission is less than 60%, the photosensitive resin laminate may be colored or opacified, making the appearance poor, and color tone may vary during post-processing, such as painting and the like, which is unpreferable.

The total light transmission (A%) of the support and the total light transmission (B%) of the photosensitive resin laminate satisfy the aforementioned formula (1). In the formula (1), the value on the right side of the equation is desirably not more than 10, particularly not more than 5. When the aforementioned formula (1) is not met, the photosensitive resin laminate has poor appearance due to coloring and turbidness, which is unpreferable because it causes different color tone during the post-processing such as painting and the like.

A signboard can be prepared from the photosensitive resin laminate of the present invention according to a method generally used for producing printing plates. For example, a negative film or positive film having a transparent image part is closely adhered onto a photosensitive resin layer via a slip coat layer or otherwise, and an actinic ray is shot thereon to insolubilize and cure only the exposed part. The actinic radiation is obtained from a light source generally having a wavelength of 300–450 nm, such as high pressure mercury lamp, ultrahigh pressure mercury lamp, metal halide lamp, xenon lamp, chemical lamp and the like.

Then, an unexposed part is removed by dissolution in a suitable solvent, particularly neutral water in the present invention, whereby a relief plate having a clear image part can be obtained. For this end, spray developing apparatus, brush developing apparatus and the like can be used.

Following the above methods, a signboard having a relief can be produced. Various signboards can be obtained, which expands the range of use, by applying a paint containing colorant, ultraviolet absorber and the like to the relief, putting gold leaf on letters and images, applying a paint, adding a pigment to a support, drawing a pattern on the back of the support or coloring the support, adhering a decorative laminate sheet and the like, or where necessary, bending while heating the support and the like.

The present invention is explained in detail by referring to examples. The present invention is not limited by these examples in any way. The evaluation in Examples was done based on the following methods.

(1) Total Light Transmission
Measured using a turbidimeter (haze meter, NDH-1001DP Nippon Denshoku Industries Co., Ltd.).

(2) Absorbance at 400–600 nm
Each photosensitive resin composition was cut out in 30 mm×70 mm, and the absorbance at 400–600 nm was measured with a self-recording spectrophotometer (U-3210, Hitachi, Ltd.).

(3) Scattering Rate of Transmitted Light
Each photosensitive resin composition was cut out in 30 mm×70 mm and heated at 95° C. for 3 min, which was subjected to the measurement of scattering rate at 360 nm using a self-recording spectrophotometer (U-3210, Hitachi, Ltd.).

(4) Turbidity
Measured using a turbidimeter (haze meter, NDH-1001DP Nippon Denshoku Industries Co., Ltd.).

(5) Ultraviolet Transmission
Each photosensitive resin composition was cut out in 30 mm×70 mm and the ultraviolet transmission at 400 nm was measured with a self-recording spectrophotometer (U-3210, Hitachi, Ltd.).

(6) Light Resistance Test
Using a Sunshine Weather Meter manufactured by Suga Test Instruments Co., Ltd., the specimen was irradiated with an arc carbon lamp for 75 hours and the light resistance was evaluated.

(7) Relief Property
A 21 step gray scale (STOUFFER GRAPHIC ARTS EQUIPMENT CO.) was placed on the surface of a photosensitive resin and exposed to light. The relief property was evaluated according to the cure step of the relief obtained after development and post-exposure.

The reproducibility of isolated dot was evaluated based on the minimum isolated dot retained on a relief prepared by the use of a negative film, from the isolated dots having a dot size of 100 μmφ, 200 μmφ, 300 μmφ and 400 μmφ.

The reproducibility of fine line was evaluated based on the minimum fine line retained on a relief prepared by the use of a negative film, from the fine lines having a line length of 30 μm, 40 μm, 50 μm, 60 μm, 80 μm, 100 μm, 120 μm and 150 μm.

The 600 μm slit depth was measured by determining the reverse depth of a relief prepared by the use of a negative film having a slit width of 600 μm.

Reference Example 1

The photosensitive resin composition to be laminated was prepared as follows. ε-Caprolactam (525 parts by weight), nylon salt (400 parts by weight) of N-(2-aminoethyl) piperazine and adipic acid, and nylon salt (75 parts by weight) of 1,3-bis(aminomethyl)cyclohexane and adipic acid were subjected to melt condensation polymerization in an autoclave to give a nylon copolymer. The obtained nylon copolymer (55 parts by weight), N-nitrosophenylhydroxylamine aluminum salt (0.01 part by weight), hydroquinone monoethyl ether (0.1 part by weight) and N-ethyltoluenesulfonamide (7 parts by weight) were dissolved in a mixed solvent of methanol (47 parts by weight) and water (96 parts by weight) at 60° C., and glycidyl methacrylate (2 parts by weight) was added. The mixture was stirred for 2 h to allow reaction of glycidyl methacrylate with the polymer terminal. To this solution were added ammonium sulfite (0.3 part by weight), oxalic acid (0.3 part by weight) and methacrylic acid (4 parts by weight), after which acrylate (31 parts by weight) obtained by ring-opening addition reaction of triglycidyl ether of trimethylolpropane and acrylic acid, and benzyl dimethyl ketal (1.0 part by weight) were added to give a solution of a photosensitive resin composition. This solution was cast on a 125 μm-thick polyester film and methanol was evaporated to give a photosensitive resin laminate precursor a having a thickness of about 800 μm.

Reference Example 2

In the same manner as in Reference Example 1 except that phenothiazine (0.04 part by weight) was added instead of N-nitrosophenylhydroxylamine aluminum salt (0.01 part by weight), a photosensitive resin laminate precursor b was obtained.

Reference Example 3

In the same manner as in Reference Example 1, nylon copolymer (55 parts by weight), N-nitrosophenylhydroxylamine aluminum salt (0.01 part by weight), hydroquinone monoethyl ether (0.1 part by weight), and N-ethyltoluenesulfonamide (7 parts by weight) were dissolved in a mixed solvent of methanol (47 parts by weight) and water (96 parts by weight) at 60° C., and glycidyl methacrylate (2 parts by weight) was added. The mixture was stirred for 2 h to allow reaction of glycidyl methacrylate with the polymer terminal. To this solution were added ammonium sulfite (0.3 part by weight), oxalic acid (0.3 part by weight) and methacrylic acid (4 parts by weight), after which acrylate (31 parts by weight) obtained by ring-opening addition reaction of triglycidyl ether of trimethylolpropane and acrylic acid, benzyl dimethyl ketal (1.0 part by weight) and phenothiazine (0.02 part by weight) were added to give a solution of a photosensitive resin composition. This solution was cast on a 125 μm-thick polyester film and methanol was evaporated to give a photosensitive resin laminate precursor c having a thickness of about 800 μm.

Reference Example 4

In the same manner as in Reference Example 1 except that 1,4-naphthoquinone (0.04 part by weight) was added instead of N-nitrosophenylhydroxylamine aluminum salt (0.01 part by weight), a photosensitive resin laminate precursor d was obtained.

Reference Example 5 (Preparation of Support)

As a support, 2 mm-thick acrylic resin (MITSUBISHI RAYON)polymethylmethacrylate, trademark ACRYLITE), hard vinyl chloride resin (vinyl chloride board manufactured by MEIVAN,) and modified polyethylene terephthalate resin (PET-G manufactured by Eastman Chemical Co., Ltd.) having a total light transmission shown in the following Table 1 were used.

As an adhesive layer, used was a polyester urethane adhesive, and a solution of the composition for adhesive layer was prepared as follows. A polyester resin (VYLON RV-200, 80 parts by weight, Toyo Boseki Kabushiki Kaisha) was heated and dissolved in a mixed solvent (1940 parts by weight) of toluene/methyl ethyl ketone=80/20 (weight ratio) at 80° C. After cooling, DESMODUER HL (20 parts by weight, Sumitomo Bayer Urethane) obtained from hexamethylene diisocyanate and toluene diisocyanate was used as an isocyanurate type polyhydric isocyanate, and triethylenediamine (0.06 part by weight) was added as a curing catalyst, after which the mixture was stirred for 10 min.

The thus-obtained solution of the composition for adhesive layer was applied on the aforementioned respective supports each having a thickness of 2 mm, such that a film thickness was 7 μm, cure-dried at 50° C. for 15 min to give a support (hereinafter to be referred to as acrylic plate, vinyl chloride plate and PET-G) having an adhesive layer.

TABLE 1

| support | | total light transmission A (%) |
|---|---|---|
| support | acrylic plate | 92.8 |
| | vinyl chloride plate | 79.3 |
| | PET-G | 89.8 |

EXAMPLES 1–3

The photosensitive resin laminate precursor a obtained in Reference Example 1 and the support obtained in Reference Example 5, which had an adhesive layer, were adhered and water was poured therebetween. A photosensitive resin layer was press-adhered at room temperature at 25° C. by passing the laminate through a rubber roller whose gap clearance had been adjusted according to the thickness of the laminate, to give a transparent and colorless photosensitive resin laminate. The results are shown in Table 2.

EXAMPLES 4–6

The photosensitive resin laminate precursor b obtained in Reference Example 2 and the support obtained in Reference Example 5, which had an adhesive layer, were adhered and water was poured therebetween. A photosensitive resin layer was press-adhered at room temperature at 25° C. by passing the laminate through a rubber roller whose gap clearance had been adjusted according to the thickness of the laminate, to give a transparent and colorless photosensitive resin laminate. The results are shown in Table 2.

EXAMPLES 7–9

The photosensitive resin laminate precursor c obtained in Reference Example 3 and the support obtained in Reference Example 5, which had an adhesive layer, were adhered and water was poured therebetween. A photosensitive resin layer was press-adhered at room temperature at 25° C. by passing the methacrylate (2 parts by weight) was added. The mixture was stirred for 2 h to allow reaction of glycidyl methacrylate with the polymer terminal. To this solution were added ammonium sulfite (0.3 part by weight), oxalic acid (0.3 part by weight) and methacrylic acid (4 parts by weight), after which acrylate (31 parts by weight) obtained by ring-opening addition reaction of triglycidyl ether of trimethylolpropane and acrylic acid, benzyl dimethyl ketal (1.0 part by weight) and phenothiazine (0.02 part by weight) added to give a solution of a photosensitive resin composition. This solution was cast on a 125 μm-thick polyester film and methanol was evaporated to give a photosensitive resin laminate precursor having a thickness of about 800 μm.

Using the obtained photosensitive resin laminate precursor and in the same manner as in Example 10, a photosensitive resin laminate was produced.

COMPARATIVE EXAMPLE 4

In the same manner as in Reference Example 1 except that 1,4-naphthoquinone (0.04 part by weight) was added instead of N-nitrosophenylhydroxylamine aluminum salt (0.01 part by weight), a photosensitive resin laminate precursor was produced.

Using the obtained photosensitive resin laminate precursor and in the same manner as in Example 10, a photosensitive resin laminate was produced.

Reference Example 6

The photosensitive resin laminates of the present invention obtained in the above-mentioned Examples 1–12 and Comoparative Example 4 were preserved for not less than 7 days, and a polyester film having a thickness of 125 μm was peeled off, and the test negative films (gray scale negative film for sensitivity measurement and image negative film for image reproducibility evaluation) were adhered in vacuo and exposed to light from a chemical lamp for 3 min. Using a brush washer laminate through a rubber roller whose gap clearance had been adjusted according to the thickness of the laminate, to give a transparent and colorless photosensitive resin laminate. The results are shown in Table 2.

COMPARATIVE EXAMPLES 1–3

The photosensitive resin laminate precursor d obtained in Reference Example 4 and the support obtained in Reference Example 5, which had an adhesive layer, were adhered and water was poured therebetween. A photosensitive resin layer was press-adhered at room temperature at 25° C. by passing the laminate through a rubber roller whose gap clearance had been adjusted according to the thickness of the laminate, to give a transparent and colorless photosensitive resin laminate. The results are shown in Table 3.

TABLE 2

| | photosensitive resin laminate precursor | support | total light transmission of laminate | $((A - B)/A) \times 100$ |
|---|---|---|---|---|
| Example 1 | a | acrylic plate | 88.4 | 4.7 |
| Example 2 | a | vinyl chloride plate | 71.2 | 10.2 |
| Example 3 | a | PET-G | 80.5 | 10.4 |
| Example 4 | b | acrylic plate | 84.9 | 8.5 |
| Example 5 | b | vinyl chloride plate | 73.3 | 7.6 |
| Example 6 | b | PET-G | 85.9 | 4.3 |
| Example 7 | c | Acrylic plate | 85 | 8.4 |
| Example 8 | c | vinyl chloride plate | 73.2 | 7.7 |
| Example 9 | c | PET-G | 80.8 | 10 |

TABLE 3

| | Comparative Example 1 | Comparative Example 2 | Comparative Example 3 |
|---|---|---|---|
| photosensitive resin laminate precursor | d | d | d |
| support | acrylic plate | vinyl chloride plate | PET-G |
| total light transmission of laminate | 59.8 | 53.3 | 58.5 |
| $((A - B)/A) \times 100$ | 35.6 | 32.8 | 34.9 |

EXAMPLE 10

In the same manner as in Example 1 except that a modified polyethylene terephthalate resin having a Shore D hardness of 60, a thickness of 1.5 mm and a total light transmission of 80%, which is a polyethylene terephthalate resin obtained by copolymerizing isophthalic acid (10 mol %), was used as a support, a transparent and colorless photosensitive resin laminate was produced.

EXAMPLE 11

In the same manner as in Reference Example 1 except that phenothiazine (0.04 part by weight) was added instead of N-nitrosophenylhydroxylamine aluminum salt (0.01 part by weight), a photosensitive resin laminate precursor was produced.

Using the obtained photosensitive resin laminate precursor and in the same manner as in Example 10, a photosensitive resin laminate was produced.

EXAMPLE 12

In the same manner as in Reference Example 1, a nylon copolymer was obtained. The obtained nylon copolymer (55 parts by weight), N-nitrosophenylhydroxylamine aluminum salt (0.01 part by weight), hydroquinone monoethyl ether (0.1 part by weight) and N-ethyltoluenesulfonamide (7 parts by weight) were dissolved in a mixed solvent of methanol (47 parts by weight) and water (96 parts by weight) at 60° C., and glycidyl (100 μmϕ nylon brush, NIHON DENSHI SEIKI CO. LTD., JW-A2-PD type) and tap water as a developing solution, the negatives were developed at 23° C. for 2 min to give a relief image. The photosensitive resin laminates in Examples 10–12 and Comparative Example 4 were dried with warm air at 60° C. for 5 min and exposed to light from an ultrahigh pressure mercury lamp for 30 sec, after which the obtained relief was evaluated. The results are shown in Table 4.

TABLE 4

| | | Example 10 | Example 11 | Example 12 | Comp. Example 4 |
|---|---|---|---|---|---|
| lami-nate | appearance of image | transparent and colorless | transparent and colorless | transparent and colorless | brown and transparent |
| | absorbance of resin layer at 400–600 nm | <0.2 | <0.2 | <0.2 | 0.4–0.8 |
| | scattering rate of resin layer | 12% | 13% | 15% | 23% |
| | turbidity of resin layer | 3.1 | 2.3 | 2.9 | 4.4 |
| relief properties | gray scale reproducibility of isolated dot | 12 step 200 μm | 12 step 200 μm | 12 step 200 μm | 12 step 200 μm |
| | reproducibility of fine line | 40 μm | 40 μm | 40 μm | 40 μm |
| | 600 μm slit depth | 138 μm | 143 μm | 145 μm | 144 μm |

EXAMPLE 13

As a support, used was a 2.0 mm-thick acrylic plate (polymethylmethacrylate resin).

As a solution of the composition for adhesive layer, used was that prepared in the above-mentioned Reference Example 5.

This solution of the composition for adhesive layer was applied on an acrylic plate having a thickness of 2.0 mm such that a film thickness was 12 μm, cure dried at 50° C. for 20 min to give a support having an adhesive layer.

The photosensitive resin composition to be laminated was prepared as follows. ε-Caprolactam (525 parts by weight), nylon salt (400 parts by weight) of N-(2-aminoethyl) piperazine and adipic acid, and nylon salt (75 parts by weight) of 1,3-bis(aminomethyl)cyclohexane and adipic acid were subjected to melt condensation polymerization in an autoclave to give a nylon copolymer. The obtained nylon copolymer (55 parts by weight) was dissolved in methanol (200 parts by weight) at 60° C., and glycidyl methacrylate (2 parts by weight) was added. The mixture was stirred for 3 h to allow reaction of glycidyl methacrylate with the polymer terminal. To this solution was added methacrylic acid (4 parts by weight), after which acrylate (35 parts by weight) obtained by ring-opening addition reaction of diglycidyl ether of glycerin and acrylic acid, N-ethyltoluenesulfonamide (5 parts by weight), hydroquinone monomethyl ether (0.1 part by weight) and benzyl dimethyl ketal (1.0 part by weight) were added to give a solution of a photosensitive resin composition. This solution was cast on a 125 μm-thick polyester film coated with 2 μm-thick poly(vinyl alcohol) having a degree of hydrolysis of 98%. Methanol was evaporated to give a photosensitive resin laminate precursor having a thickness of about 800 μm.

The photosensitive resin laminate precursor obtained above and a support having an adhesive layer were adhered as follows. The surface of a photosensitive resin composition and the surface of a support were registered and water was poured between these surfaces. The photosensitive resin layer was press-adhered at room temperature at 25° C. by passing the laminate through a rubber roller whose gap clearance had been adjusted according to the thickness of the laminate, to give a photosensitive resin laminate. The photosensitive resin laminate was stood for one day and cut into a predetermined size with a circular saw teeth cutter. A negative was placed thereon and subjected to exposure, development, drying and post-exposure treatment to form a pattern of the signboard.

Then, a coating layer (thickness 50 μm) was applied to the surface of the photosensitive resin laminate having the signboard pattern. The coating layer was formed as in the following. A polyester resin (VYLON RV-200, 76 parts by weight, Toyo Boseki Kabushiki Kaisha) was heated and dissolved in a mixed solvent (177 parts by weight) of toluene/methyl ethyl ketone=80/20 (weight ratio) at 80° C. After cooling, CORONATE L (19 parts by weight, polyhydric isocyanate manufactured by NIPPON POLYURETHANE INDUSTRY CO., LTD.), dehydrothio-p-toluidine (5 parts by weight) as an ultraviolet absorber, triethylenediamine (0.1 part by weight) as a curing catalyst and ethyl acetate (50 parts by weight) were added and the mixture was stirred for 10 min. The obtained coating solution was applied to the surface of the pattern of the photosensitive resin laminate by a spray method, and dried at 50° C. for 1 h to give a photosensitive resin signboard having a coating layer.

The obtained photosensitive resin signboard was subjected to the light resistance test for 75 h, and absorbance at 400 nm was measured. The absorbance after the light resistance test was 0.25 and the ultraviolet transmission was not more than 10%, demonstrating superior resistance to light.

COMPARATIVE EXAMPLE 5

In the same manner as in Example 13 except that a coating layer was not formed on the surface of the photosensitive resin laminate having a signboard pattern, a photosensitive resin signboard was obtained, which was then subjected to a light resistance test. The absorbance at 400 nm of the photosensitive resin signboard before the light resistance test was 1.10, showing poor light resistance of the photosensitive resin signboard.

EXAMPLE 14

In the same manner as in Example 13 except that 1 mm-thick modified polyethylene terephthalate resin plate obtained by copolymerizing 20% cyclohexanedimethanol was used as a support, a photosensitive resin signboard was obtained.

The obtained photosensitive resin signboard was subjected to the light resistance test for 75 h, and absorbance at 400 nm was measured. The absorbance after the light resistance test was 0.19, and the ultraviolet transmission was not more than 5%, demonstrating superior resistance to light.

EXAMPLE 15

In the same manner as in Example 13 except that the ultraviolet absorber of the coating layer was changed to 2-amino-3-naphthoic acid, a photosensitive resin signboard was obtained.

The obtained photosensitive resin signboard was subjected to the light resistance test for 75 h, and absorbance at 400 nm was measured. The absorbance after the light resistance test was 0.22, and the ultraviolet transmission was not more than 10%, demonstrating superior resistance to light.

EXAMPLE 16

In the same manner as in Example 13 except that the ultraviolet absorber of the coating layer was changed to 2-amino-benzophenone, a photosensitive resin signboard was obtained.

The obtained photosensitive resin signboard was subjected to the light resistance test for 75 h, and absorbance at 400 nm was measured. The absorbance after the light resistance test was 0.24, and the ultraviolet transmission was not more than 20%, demonstrating superior resistance to light.

EXAMPLE 17

As a support, used was a 2.0 mm-thick acrylic plate (polymethylmethacrylate resin) having a total light transmission of 92.8%.

As a solution of the composition for adhesive layer, used was that prepared in the above-mentioned Reference Example 5.

The thus-obtained solution of the composition for adhesive layer was applied on the 2.0 mm-thick acrylic plate such that a film thickness was 12 μm, cure dried at 50° C. for 20 min to give a support having an adhesive layer.

The photosensitive resin composition to be laminated was prepared as follows. Poly(vinyl acetate) having a degree of hydrolysis of 36% (55 parts by weight, SMR-30L, Shin-Etsu Chemical Co., Ltd.) was stirred in methanol (100 parts by weight) at 60° C. for 2 h to completely dissolve the polymer. To the obtained solution were added a solution of sodium laurylbenzenesulfonate (3 parts by weight) dissolved in water (10 parts by weight), and hydroquinone monomethyl ether (0.1 part by weight), acrylic acid adduct of bisphenol A diglycidyl ether (40.9 parts by weight) and benzyl dimethyl ketal (1 part by weight) were added and the mixture was stirred for 30 min to give a solution of the photosensitive resin composition. This solution was cast on a polyester film having a polyvinyl alcohol having a hydrolysis degree of 98%, which was coated in a thickness of 2 μm. Methanol was evaporated to give a photosensitive resin laminate precursor having a thickness of about 800 μm.

The photosensitive resin laminate precursor obtained above and a support having an adhesive layer were adhered as follows. The surface of a photosensitive resin composition and the surface of a support were registered and water was poured between these surfaces. The photosensitive resin layer was press-adhered at room temperature at 25° C. by passing the laminate through a rubber roller whose gap clearance had been adjusted according to the thickness of the laminate, to give a photosensitive resin laminate. The photosensitive resin laminate was stood for one day and cut into a predetermined size with a circular saw teeth cutter. A negative was placed thereon and subjected to exposure, development, drying and post-exposure treatment to give a signboard whose photosensitive resin layer has a UV absorbance of 0.28.

The relief part of the obtained photosensitive resin signboard was colored with a blue spray paint (blue acrylic spray, ASAHI-PEN CO., LTD.), and on the back of the support without a photosensitive resin layer was registered with a color photograph showing a sand beach, and fixed with an aluminum frame.

The obtained signboard which had a layer having an image laminated on a support side had superior design of sand beach as the scenic backdrop with a display relief colored in blue.

COMPARATIVE EXAMPLE 6

As a support, used was a phenol board having a thickness of 2.0 mm and a total light transmission of 0%.

In the same manner as in Example 17 except the use of the above-mentioned support, a photosensitive resin laminate was produced. The obtained photosensitive resin laminate was stood for one day and cut into a predetermined size with a circular saw teeth cutter. A negative was placed thereon and subjected to exposure, development, drying and post-exposure treatment to form a pattern of the signboard. The entire surface of the obtained signboard was colored with a spray paint of Example 17 and the relief part was colored with a gold acrylic spray paint (ASAHI-PEN CO., LTD.). However, it was poor in design because the scenic backdrop was not a photograph.

EXAMPLE 18

The image photograph used in Example 17 was changed to a sheet with a stone pattern to give a signboard having a layer having an image laminated on the support side.

The obtained photosensitive resin signboard was superior in design with the stone pattern as the background and a display relief colored in blue.

EXAMPLE 19

The color photograph showing a sand beach used in Example 17 was adhered to the back of the support without a photosensitive resin layer with an adhesive. A wood adhesive (CEMEDINE CO., LTD.) was applied to the back of the support and immediately adhered to the photograph to give a signboard having an image layer laminated on the support.

The obtained photosensitive resin signboard was superior in design with the stone pattern as the background and a display relief colored in blue.

EXAMPLE 20

In the same manner as in Example 17, a signboard having a relief layer was obtained from the photosensitive resin laminate.

Using a screen printing machine (MT-320, MURAKAMI CO., LTD.), a layer having a pattern of 1 cm wide alternate print of indigo blue and dark indigo of PRT ink for screen print obtained from MURAKAMI CO., LTD. printed with a polyester 200 mesh silk gauze was laminated on the back of the support of the obtained signboard.

The obtained photosensitive resin signboard was superior in design with a pattern of the alternate dark blue and blue prints as the background.

The photosensitive resin laminate of the present invention having the above-mentioned constitution has a transparent photosensitive resin layer. This has an effect that the design of the support can be reflected well, and a signboard having any design can be produced depending on the material of the support, printed pattern and the like. In addition, the support can be bent easily, which enables provision of a photosensitive resin laminate suitable for a signboard, thus greatly contributing to the industrial field.

The photosensitive resin signboard of the present invention having the above-mentioned constitution is superior in light resistance, and shows only a small degree of coloring due to UV light. Therefore, it can function as an outdoor signboard for a long time. Since it has a layer having an image laminated on the support side, the signboard of the present invention can provide a superior design, thus greatly contributing to the industrial field.

This application is based on application Nos. 2000-225650, 2000-227431, 2000-243126 and 2000-336217 filed in Japan, the contents of which are incorporated hereinto by reference.

What is claimed is:

1. A photosensitive resin laminate comprising a support, an adhesive layer and a photosensitive resin layer, wherein the photosensitive resin laminate shows a total light transmission of not less than 60% and wherein the photosensitive resin layer has a thickness of not less than 500 μm.

2. The photosensitive resin laminate of claim 1, wherein the photosensitive resin layer has a Shore D hardness of not less than 50.

3. The photosensitive resin laminate of claim 1, wherein the photosensitive resin layer has an absorbance at 400 nm–600 nm of not more than 0.3.

4. The photosensitive resin laminate of claim 1, wherein the photosensitive resin layer has a scattering rate of not more than 25%.

5. The photosensitive resin laminate of claim 1, wherein the photosensitive resin layer has a turbidity of not more than 3.5.

6. The photosensitive resin laminates of claim 1, wherein the photosensitive resin layer contains a hydroxylamine derivative.

7. A plate for a signboard comprising the photosensitive resin laminate of claim 1.

8. A signboard having a relief, which comprises the photosensitive resin laminate of claim 1, wherein the photosensitive resin layer has a thickness of not less than 500 μm and is formed at least on the support via the adhesive layer, and a coating layer having a transmission at 400 nm of not more than 50% on its surface.

9. A signboard having a relief, which comprises the photosensitive resin laminate of claim 1, and a layer having an image laminated on a side of the support.

10. The signboard of claim 9, wherein the layer having the image is directly printed on the support.

11. A photosensitive resin laminate comprising a support, an adhesive layer and a photosensitive resin layer, which laminate satisfying the following formula (1):

$$\{(A-B)/A\}\times 100 \leqq 15 \qquad (1)$$

wherein A is a total light transmission (%) of the support and B is a total light transmission (%) of the photosensitive resin laminate and wherein the photosensitive resin layer has a thickness of not less than 500 μm.

12. The photosensitive resin laminate of claim 11, wherein the photosensitive resin layer has a Shore D hardness of not less than 50.

13. The photosensitive resin laminate of claim 11, wherein the photosensitive resin layer has an absorbance at 400 nm–600 nm of not more than 0.3.

14. The photosensitive resin laminate of claim 11, wherein the photosensitive resin layer has a scattering rate of not more than 25%.

15. The photosensitive resin laminate of claim 11, wherein the photosensitive resin layer has a turbidity of not more than 3.5.

16. The photosensitive resin laminates of claim 11, wherein the photosensitive resin layer contains a hydroxylamine derivative.

17. A plate for a signboard comprising the photosensitive resin laminate of claim 11.

18. A signboard having a relief, which comprises the photosensitive resin laminate of claim 11, wherein the photosensitive resin layer has a thickness of not less than 500 μm and is formed at least on the support via the adhesive layer, and a coating layer having a transmission at 400 nm of not more than 50% on its surface.

19. A signboard having a relief, which comprises the photosensitive resin laminate of claim 11, and a layer having an image laminated on a side of the support.

20. The signboard of claim 19, wherein the layer having the image is directly printed on the support.

* * * * *